United States Patent [19]
Jain

[11] Patent Number: 5,059,013
[45] Date of Patent: Oct. 22, 1991

[54] ILLUMINATION SYSTEM TO PRODUCE SELF-LUMINOUS LIGHT BEAM OF SELECTED CROSS-SECTION, UNIFORM INTENSITY AND SELECTED NUMERICAL APERTURE

[76] Inventor: Kantilal Jain, 18 Algonquian Trail, Briarcliff Manor, N.Y. 10510

[21] Appl. No.: 237,347

[22] Filed: Aug. 29, 1988

[51] Int. Cl.$^5$ ............................ G02B 7/00; G02B 6/00
[52] U.S. Cl. .................................. 359/503; 359/894; 359/900; 385/146; 385/147
[58] Field of Search ...................... 350/574, 96.1, 320, 350/169, 433, 448, 319, 572, 577, 311

[56] References Cited
U.S. PATENT DOCUMENTS
3,370,502  2/1968  Wilks ................................. 350/96.1
3,600,568  8/1971  Weyrauch ........................... 350/96.1

*Primary Examiner*—Bruce Y. Arnold
*Assistant Examiner*—James Phan
*Attorney, Agent, or Firm*—Carl C. Kling

[57] ABSTRACT

This illumination system produces a light beam of selected cross-section shape and uniform intensity, which emits self-luminously into a selected numerical aperture, by: providing a non-uniform, non-self-luminous laser light beam; configuring the beam to eliminate the non-uniformities near the beam periphery; providing the semi-uniform light beam to a light gate; providing also a lamp light beam with optics and infra-red trap; gating selectively the laser light beam or the lamp light beam to a light beam characterization subsystem; configuring the selected semi-shaped semi-uniform non-self-luminous light beam to provide a selected shaped semi-uniform non-self-luminous light beam; focusing the selected shaped semi-uniform non-self-luminous light beam, with a focal length related to the selected numerical aperture, onto the input plane of a total-internally-reflective beam-shaper-uniformizer, causing multiple reflections within the uniformizer and overlapping of different parts of the beam with one another, the length of the beam-shaper-uniformizer being related to the selected intensity uniformity, resulting in a selected shaped uniform semi-self-luminous light beam at the exit plane; diffusing the light beam; passing the selected shaped uniform self-luminous light beam through a collection lens to convey the beam with the selected numerical aperture toward an application subsystem.

22 Claims, 2 Drawing Sheets

ILLUMINATION SYSTEM TO PRODUCE SELF-LUMINOUS LIGHT BEAM OF SELECTED CROSS-SECTION, UNIFORM INTENSITY AND SELECTED NUMERICAL APERTURE

BACKGROUND OF THE INVENTION

1. Field of the Invention

This invention relates to light beam illumination systems, and more particularly relates to method and apparatus for producing a light beam of selected cross-section shape and uniform intensity, and which emits self-luminously into a selected numerical aperture.

2. Description of the Prior Art

Precision illumination systems are used extensively in the production of integrated circuit chips and electronic circuit boards. Such illumination systems typically include a primary light source such as a high intensity lamp or a laser; a target positioning system; a protection system to illuminate the target with the selected pattern; and a control system. The intent typically is to illuminate a chip covered with a photoactive layer so as to produce the desired circuit pattern, which later will be metallized or otherwise activated during further processing. Illumination may be by ultraviolet light, visible light, electron-beam or a combination spectrum of radiation. The desire is to illuminate the target chip selectively, so as to activate a particular pattern. Integrated circuit chips typically undergo several illumination steps during production.

The high resolution illumination systems used in such applications as semiconductor integrated circuit production, and in production of electronic circuit boards, use or high-intensity lamps or lasers as producers of primary light beams and may employ lens systems to expand the primary beams into beams of the desired shape and intensity. The expanded light beams may however not be of uniform intensity when expanded. If derived from a laser source or via collimating lens systems, the beam may be collimated and thus lack the self-luminance property which many applications demand.

Uniformation of the light beam transverse intensity distribution has in the prior art been approached by such light scattering artifices as a fly's-eye lens, a diffuser or a rotating mirror.

Self luminance is the characteristic of uniformity of multi-directional light emissivity at all points across a light beam.

The self-luminance property of an illumination system is such that any point across the beam emits into a range of directions, in a core which may be described in terms of a numerical aperture. Collimated light, that is, light which is not scattered but in which each ray is parallel to the beam axis, provided when a laser is the primary light source. A collimated light beam from a laser is not self-luminous. Light from certain high-intensity lamps may be collimated be associated reflection and lens systems and thus is not self-luminous.

The varying demands of industrial applications of illumination systems are best served by an illumination systems which efficiently produces a light beam of desired wavelength and cross-section shape, having the property of uniform intensity distribution across the cross-section, and having the self-luminance property with a desired numerical aperture of emission. These demands have typically been approached by using a primary light source subsystem which is lacking in uniformity, and providing uniformization in the light beam characterization subsystem through some artifice such as a fly's-eye lens, diffuser or rotating mirror.

An approach of the prior art is to use some efficient source of light, such as a halogen lamp with optics, or a laser, as a primary light source. This typically produces a collimated light beam. Typically, a diffuser plate etched to a degree of roughness is used to provide the desired uniformity property.

Another approach of the prior art is to use a fly's-eye lens to provide the uniformity property to the beam. The fly's-eye lens is a multiple lens array, which essentially replicates the scene hundreds of times, and can thus scatter the light so as to replicate the point source hundreds of times and thus provide the uniformity property. Note that the fly's-eye lens is thus essentially used as a diffuser.

Another approach of the prior art is to use a concentrated light beam from a primary source, but to scan the concentrated light beam across the desired cross-section by using a rotating mirror.

The artifices used to provide the self-luminous property have tended to reduce efficiency. There has been a continuing need for improvement in illumination systems.

SUMMARY OF THE INVENTION

The object of the invention is to provide an illumination system producing a light beam, of selected cross-section and uniform intensity, which emits self-luminously into a selected numerical aperture of emission.

A feature of the invention is the focusing of the light beam into a cylindrical beam-shaper-uniformizer of polygonal cross-section and with internally reflecting surfaces, the focal length of the focusing lens being selected to provide the selected numerical aperture and the beam-shaper-uniformizer providing the self-luminance and uniformity property.

Another feature of the invention is the provision of multiple light sources, each to provide a light beam selectively, via a flip-mirror gate system to a common optical train including focusing lens and beam-shaper-uniformizer.

Another feature is the method of providing a light beam for industrial patterning, using steps designed to accept light from a light beam source subsystem in collimated form and to configure and render the light beam uniform and self-luminous, with the selected numerical aperture, in a light beam characterization subsystem. An advantage of the illumination system is that it accepts an undesirably shaped, non-uniform and non-self luminous light beam from an appropriately selected light source subsystem and forwards the light beam via an efficient light beam characterization subsystem which shapes and uniformizes the light beam and adds the self-luminance property as required by utilization apparatus.

DESCRIPTION OF THE PREFERRED EMBODIMENT

This invention makes it possible to transform the radiation from any source, including a laser such as an excimer laser, and including a short-arc lamp with associated reflector and filters. The transformation changes the beam into the selected hexagonal (of other polygon) cross-section, uniform intensity distribution, and the property of being self-luminous with the selected numerical aperture of emission. The apparatus to achieve these objectives includes a light beam source subsystem (FIG. 1A) and a light beam characterization subsystem (FIG. 1B).

The preferred light beam source subsystem includes both a laser source and a lamp source, with gating means for selection. The laser light starts as an undesirably shaped and non-uniform beam. The beam is first passed through a rectangular aperture which truncates the extreme non-uniformities around the beam periphery. Next, a cylindrical beam expander is used to produce a beam with a square cross-section. The beam then passes to the light beam characterization subsystem shown in FIG. 1B. The beam is shaped by a hexagonal aperture, then focused by a focusing lens onto the input plane of a hexagonal beam-shaper-uniformizer. The focal length of the focusing lens is selected so as to produce the desired numerical aperture.

The hexagonal beam-shaper-uniformizer consists of a hollow or solid cylinder with a hexagonal cross-section and six, internally reflecting surfaces. A hollow cylinder is made by cementing six internally-mirrored panels together; a solid cylinder is made of polished quartz.

The hollow cylinder beam-shaped-uniformizer is made of a package of six metal or dielectric mirror strips. A solid cylinder is made of a quartz rod of hexagonal cross-section. In the solid quartz rod, reflections take place by the phenomenon of total internal reflection. Intensity uniformization of the beam cross-section takes place as a result of multiple reflections within the uniformizer and the overlapping of different parts of the beam with one another. The length of the cylinder is determined by the intensity uniformity desired. A quartz diffuser, placed at the exit end of the hexagonal cylinder, makes collimated output radiation self-luminous. Finally, a collection lens of the appropriate focal length will convey the beam with the selected numerical aperture to its intended application.

The above approach is also applicable for non-laser sources which have a non-circular extended radiation surface, e.g., a linear arc lamp. For sources which are essentially point sources or extended point sources, such as a laser with a gaussian beam or a short-arc lamp, a collimating lens is used to produce a collimated beam with a circular cross-section.

Figure 1A:
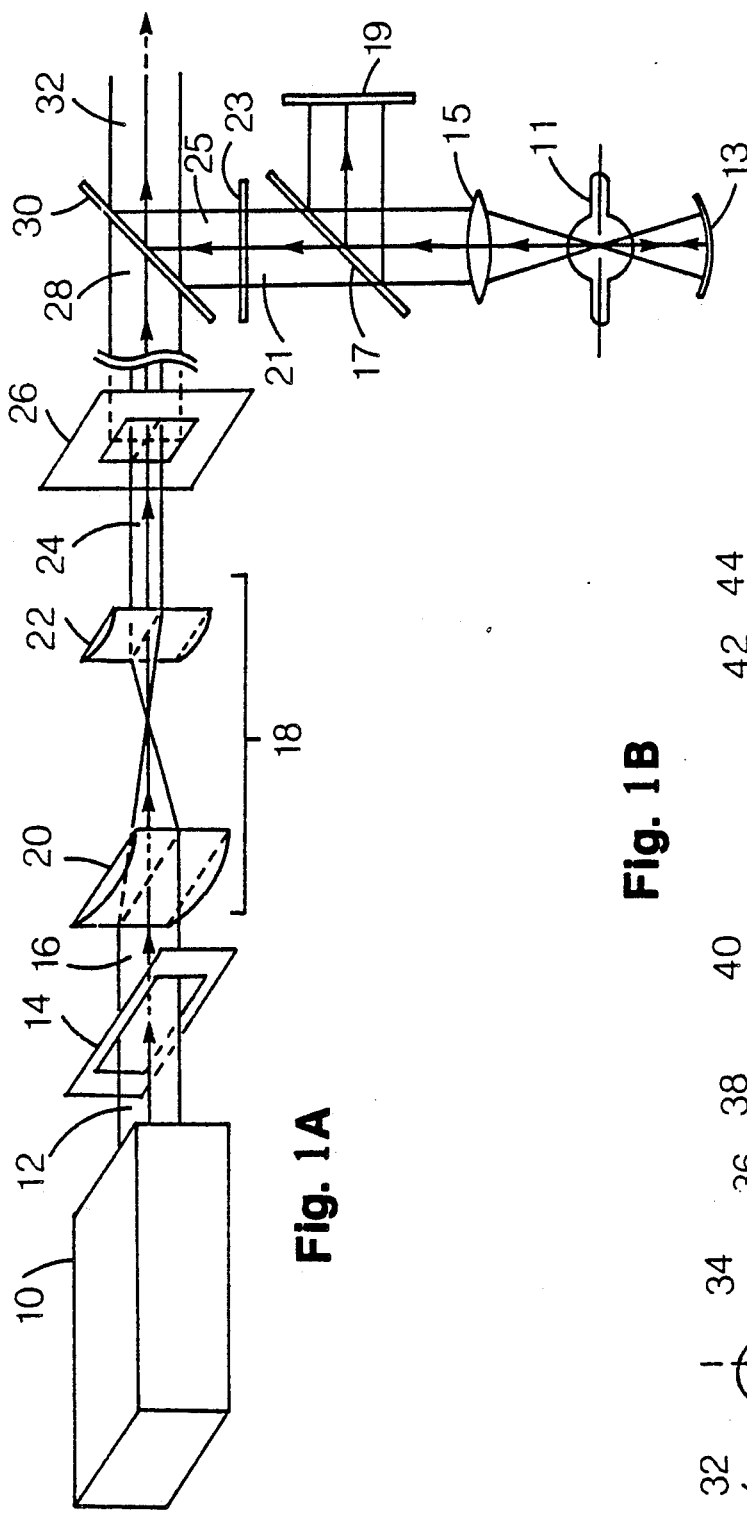
FIG. 1A is a diagram illustrating the light beam source subsystem. This subsystem includes a multiple primary light source which provides a semi-shaped light beam alternatively from a laser source or a short-arc lamp to a selecting light gate. An excimer laser with transforming optics provides a semi-shaped light beam at the light gate; a short-arc lamp with reflector and collimating lens provides a second semi-shaped light beam at the light gate.
Figure 1B:
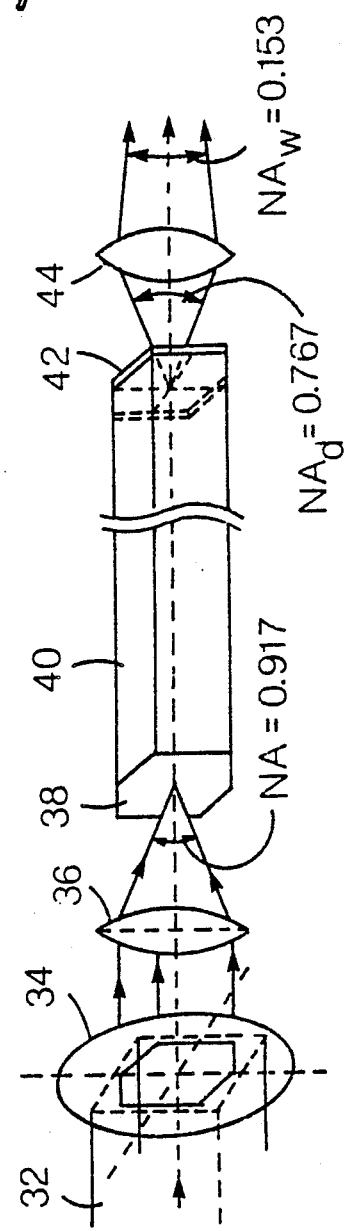
FIG. 1B is a diagram illustrating the light beam characterization subsystem. The continuation of the optical train takes the light beam from the light gate through a hexagonal beam-shaper-uniformizer and associated optical system including a diffuser. This continuation of the optical train provides a self-luminous beam of selected hexagonal cross-section, uniform intensity distribution and selected numerical aperture.

FIG. 1A shows the preferred light beam source subsystem. Excimer laser 10 emits beam 12 which is to be transformed into a light beam of selected cross-section, uniform intensity distribution and selected numerical aperture. Beam 12 is first passed through a rectangular aperture 14. Dimensions of aperture 14 are chosen to truncate the highly non-uniform peripheral regions of beam 12. Beam 16, which now has sharp edges, is next made into a beam of a square cross-section by sensing it through a cylindrical beam contractor 18, which consists of two cylindrical lenses 20 and 22. The periphery of the outcoming beam 24 is further refined by trimming it with the square aperture 26. Flip mirror 30 serves as an optical gate; it is swung out of the beam path if the radiation source is a laser or lamp with an extended source size, as above, in which case beam 32 is the same as beam 28.

A point source or an extended point source, e.g., a short-arc lamp, may also be used. Radiation from lamp 11, enhanced by reflector 13, is collimated by lens 15. Dielectric beam splitter 17 is so coated that it transmits ultraviolet (UV) light and reflects infra-red (IR) light and reflects infra-red (IR) light. The infra-red light is absorbed by IR sink 19. The UV beam 21 is filtered by a narrow-band filter 23. The output beam 25 is reflected by flip mirror 30 (which is now in the position shown in FIG. 1A) and becomes beam 32. Thus, beam 32 comes either from lamp 13 or from laser 10 depending on whether flip mirror 30, is moved out of the position shown in FIG. 1A (laser) or moved into the position shown in FIG. 1A (lamp).

FIG. 1B shows the light beam characterization subsystem. Beam 32 first passes through a hexagonal shaping aperture in shaping plate 34, after which it is focused by focusing lens 36 onto input plate 33 of the polygonal cylindrical beam-shaper-uniformizer 40. The beam-shaper-uniformizer 40 polygonal cylinder may be any one of a variety of cross-sectional shapes, including triangular, square, oval, circular, rectangular, even irregular, but hexagonal is preferred. The shaping aperture 34 should match the cross-section of the cylinder.

METHOD OF OPERATION

The invention carries out the method for providing a light beam for industrial patterning, using the following steps:

1. Providing in a light beam source subsystem an unshaped, non-uniform, non-self-luminous first light beam from a first primary light source, such as an excimer laser;

2. Truncating the first light beam through a polygon aperture to eliminate the non-uniformities near the beam periphery, resulting in a partially shaped semi-uniform, non-self-luminous truncated light beam;

3l. Expanding the truncated light beam to a semiprocessed shape, resulting in a semi-shaped semi-uniform non-self-luminous first light beam of a semiprocessed shape;

4. Trimming and providing to a light gate the semi-shaped semi-uniform non-self-luminous trimmed first light beam of a semiprocessed shape;

5. Providing also in the light beam source subsystem an unshaped, non-uniform, non-self-luminous second light beam from a second primary light source, such as a halogen lamp with optics and infra-red trap, resulting in a semi-shaped semi-uniform non-self-luminous second light beam of a semiprocessed shape;

6. Providing to the light gate the semi-shaped semi-uniform non-self-luminous second light beam of a semiprocessed shape;

7. Operating the light gate selectively to pass selectively from the light beam source subsystem the first or the second semi-shaped semi-uniform non-self-luminous light beam to a light beam characterization subsystem;

8. Passing the selected semi-shaped semi-uniform non-self-luminous light beam through a final shaping aperture to provide a selected shaped semi-uniform non-self-luminous light beam;

9. Focusing the selected shaped semi-uniform non-self-luminous light beam, with a focal length related to the desired numerical aperture, onto the input plane of a total-internally-reflective polygon-cylindrical beam-shaper-uniformizer, causing multiple reflections within the uniformizer and overlapping of different parts of the beam with one another, the length of the polygon-cylindrical beam-shaper-uniformizer being related to the desired intensity uniformity, resulting in a selected shaped uniform semi-self-luminous light beam at the exit plane;

10. Passing the selected shaped uniform semi-self-luminous light beam through a diffuser to provide a selected shaped uniform self-luminous light beam; and 11. Passing the selected shaped uniform self-luminous light beam through a collection lens to convey the beam with the selected numerical aperture toward an application subsystem.

Some steps, particularly those involving lenses and those involving aperture plates, may be combined where the application permits.

Figure 2:
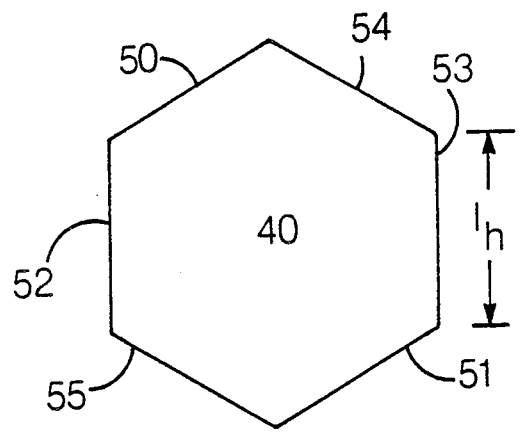
FIG. 2 is a diagram showing details of the cross-section of the hexagonal beam-shaper-uniformizer.

FIG. 2 shows the relationships in the cylinder cross-section. The hexagonal beam-shaper-uniformizer 40 consists of six internally reflecting surfaces 50–55. In the hollow cylinder these surfaces are the reflecting surfaces of six front-surface mirror strips. For a solid cylinder a rod of hexagonal cross-section made of a suitable material, such as quartz, is used in which reflections take place by the phenomenon of total internal reflection. For purposes of discussion generally, the beam-shaper-uniformizer 40 will be described as a cylinder and as being totally internally reflective, recognizing that a rod or a hollow structure with inside surface mirroring may depart from the ideal in some parameter.

Figure 3:
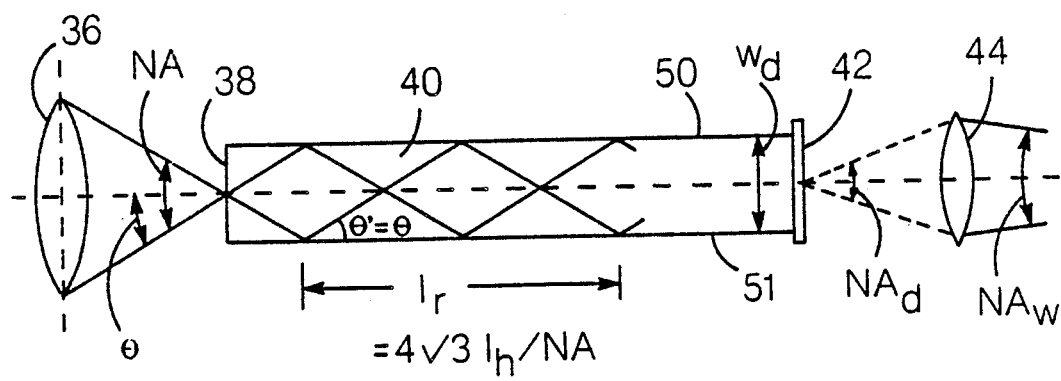
FIG. 3 is an operational diagram illustrating the ray paths, numerical apertures and other optical details of the beam-shaper-uniformizer and associated optical systems of the light beam characterization subsystem shown in FIG. 1A.

Reflections within the hexagonal beam-shaper-uniformizer 40 take place between each of the three pairs of oppositely placed parallel reflecting surfaces. In FIG. 2 these pairs are 50–51, 52–53 and 54–55, each with a separation of $w_d$, given by $$w_d = \sqrt{3} l_h,$$

where $l_h$ is the length of each side of the hexagon. Optical rays detailing the reflections between one such pair are shown in FIG. 3. Uniformization of the transverse intensity distribution of the beam takes place by the multiple reflections shown in FIG. 3, and by subsequent overlapping of different parts of the beam with one another. The exit numerical aperture (NA) of the beam-shaper-uniformizer 40 is identical to the entrance NA; thus, the desired NA of the output beam is obtained by appropriate choice of lens 36 such that come angle $\theta$ (see FIG. 3) at the input is equal to $$\sin^{-1}(NA/2).$$

As also shown in FIG. 3, a ray travels a distance $l_r$, given by $$l_r = 4\sqrt{3} l_h NA.$$

Note that this equation omits the term Cosine Theta, which for working purposes is approximated at  Cosine value=unity  because the angle is so small. Light rays that travel in planes other than those that are perpendicular to pairs of reflecting surfaces, and thus have different path lengths, might be perceived as having a coma-like effect at surface 42, but this is academic only. Any such coma-like effect would be completely nondetrimental, since there is no imaging taking place in the system in the functioning of the invention. Light rays having differing path lengths, however, contribute to the overlapping between various rays and improve the uniformization. The thorough mixing between rays entering the hexagonal cylinder at different angles improves performance as uniformizer.

The beam uniformity finally achieved depends on the number of internal reflections, which, in turn, determines the length L of the hexagonal beam-shaper-uniformizer 40. For example, if N internal reflections are desired, the length should be $$L = 2\sqrt{3} N l_h / NA.$$

In a solid cylinder made of a material of refractive index n, the ray angle within the cylinder is given by $$\sin \theta = n \sin \theta', \text{ i.e., } \theta' = \sin^{-1}(NA/2n).$$

In this case, $l_r$ given by $$l_r = 4\sqrt{3} n l_h / NA$$

and the length of the hexagonal beam-shaper-uniformizer 40 for N internal reflections should be $$L = 2\sqrt{3} n N l_h / NA.$$

The beam-shaper-uniformizer cylinder 40 is terminated at the exit by diffuser 42, which serves to make the beam more uniform and self-luminous. Collection lens 44 and its placement are chosen such that (a) the collection NA from the diffuser 42, $NA_d$, is slightly less than, and related to, the NA inside the hexagonal beam-shaper-uniformizer 40 by the diffuser efficiency $\epsilon$, given by $$\epsilon = (NA_d/NA)^2, \text{ and}$$

(b) an image of the diffuser is formed with the required magnification on the application plane.

EXAMPLE

Details of a hexagonal beam-shaper-uniformizer 40 and associated optics designed for use with an excimer laser will now be presented. As shown in FIG. 3, $l_h$, the length of each side of the hexagonal cross-section of the beam-shaper-uniformizer 40, is 7.07 mm. The separation between each pair of oppositely placed parallel reflecting surfaces is $$w_d = \sqrt{3} l_h = 12.25 \text{ mm}.$$

The reflecting surfaces are 7.07 mm wide strips of front-surfaces aluminum mirrors with protective coating for the UV radiation of the excimer laser. Aperture 34 has the same directions as the cross-section described above, the maximum extent of the input beam from top to bottom thus being $2l_h = 14.14$ mm. Lens 36 is designed for an input NA of 0.917; thus, with a clear aperture of 14.14 mm diameter, its focal length is $$f_1 = 2l_h/NA = 14.14/0.917 \text{ mm} = 15.42 \text{ mm},$$

and the cone angle is $$\theta = \sin^{-1}(0.917/2) = 27.3°.$$

Within the beam-shaper-uniformizer 40, the longitudinal distance traveled by a ray between two reflections is $$l_r/2 = 2w_d/NA = 2(12.25/0.917) \text{ mm} = 26.72 \text{ mm}.$$

The length of the beam-shaper-uniformizer 40, and therefore of each mirror strip, is determined so as to produce 10 internal reflections; thus, L = 267.2 mm.

Instead of mirror strips, if the hexagonal beam-shaper-uniformizer 40 consists of a solid cylinder made of a material of refractive index n = 1.5, $$l_r/2 = 2nw_d/NA = 40.08 \text{ mm},$$

and L, for 10 reflections, should be 400.8 mm. The diffuser 42 is made of quartz by grinding and etching; an efficiency of 70% is readily obtained. Hence the exit NA collected by lens 44 is given by $$NA \text{ (diffuser, exit)} = [0.7 \times NA^2 \text{ (input)}]^{\frac{1}{2}} = 0.767.$$

Lens 44 is designed for an NA of 0.767 on the object side and 0.153 on the image side, giving a magnification of 5. With a clear aperture of 14.14 mm, lens 44 is positioned at a distance $$u = 14.14/0.767 \text{ mm} = 18.44 \text{ mm}$$

from diffuser 42, and its focal length is $$f_2 = 5u/6 = 15.36 \text{ mm}.$$

The illuminated system of the invention has been described in terms of a light beam source subsystem (FIG. 1A) having two light sources selectively gated, and in terms of a light beam characterization subsystem (FIG. 1B) using a hexagonal cylinder. Various alternatives and departures have been mentioned, and a very detailed example given of the preferred embodiment. It will be obvious to those skilled in directable beam illumination systems for industrial applications similar to chip patterning to carry out a variety of modifications within the spirit and scope of the invention, as stated in the following claims.

What is claimed is:

1. An illumination system for producing a light beam having selected characteristics of cross-section, uniform intensity distribution, self-luminance and numerical aperture, having a light beam source subsystem (10–32, FIG. 1A) for providing a light beam having characteristics differing from the characteristics selected and having a light beam characterization subsystem (34,36,38,40,42,44) for altering the characteristics of the light beam for selected cross-section shape, uniform intensity, and self-luminous emission into the selected numerical aperture, said light beam characterization subsystem comprising:

(a) beam shaping means (34, FIG. 1B), optically related to the selected cross-section shape, optically associated with said primary light source subsystem;
   (b) focusing means (36) related to the selected numerical aperture, optically associated with said beam shaping means (34); and
   (c) beam-shaper-uniformizer means (40), optically associated with said focusing means (36), of polygon-cylindrical configuration having internally reflecting surfaces, having input and exit planes, having its length related to its index of refraction and to the selected number of internal reflections to accomplish the selected uniformization.

2. An illumination system according to claim 1, wherein said light beam source subsystem comprises:
   (a) a laser (10);
   (b) a truncating aperture plate (14) to truncate the exterior portions of the light beam, a cylindrical beam contractor (18); and
   (c) a trimming aperture plate (26); to provide to said light beam characterization subsystem a semi-shaped, semi-uniform, non-self-luminous light beam from a laser primary light source.

3. An illumination system according to claim 1, wherein said light beam source subsystem comprises:
   (a) lamp means (11,13,15); and
   (b) infra-red filtering means (17,19,23) to provide to said light beam characterization subsystem a semi-shaped, semi-uniform, non-self-luminous light beam from a lamp primary light source.

4. An illumination system according to claim 1, wherein said light beam source subsystem comprises first primary light source (10,14,18,26) and second primary light source (11,13,15,17,19,23), each primary light source providing a light beam selectively via an optical gate (30) to said light beam characterization subsystem.

5. An illumination system according to claim 4, wherein said first primary light source includes an excimer laser (10), said second primary light source includes a short-arc lamp (11), and said optical gate includes a flip mirror (30).

6. An illumination system according to claim 1, wherein said beam shaping means (34) is an aperture plate with a hexagonal aperture.

7. An illumination system according to claim 1, wherein said beam-shaper-uniformizer means (40) is a hollow cylinder having mirrored inside surface of high reflectivity.

8. An illumination system according to claim 1, wherein said beam-shaper-uniformizer means (40) is a solid transparent cylinder having the property of total internal reflectivity.

9. An illumination system according to claim 1, wherein said beam-shaper-uniformizer means (40) has cylinder length equal to ten reflections.

10. An illumination system according to claim 8, wherein said solid cylinder is composed of quartz.

11. An illumination system according to claim 1, having diffuser means (42) positioned at the exit plane of said beam-shaper-uniformizer means (40).

12. An illumination system according to claim 1, wherein said focusing means (36) has its focus at the input plane of said beam-shaper uniformizer means (40)

with a focal length selected to produce the selected numerical aperture.

13. An illumination system according to claim 12, wherein said beam-shaper-uniformizer means (40) is a hollow cylinder having mirrored inside surfaces of high reflectivity, and said focusing means (36) focuses the beam at the input plane such that input numerical aperture and exit plane numerical apertures are identical and the cone angle ($\theta$) at the input plane is $$\sin^{-1}(NA/2),$$

and the length of said hollow cylinder for N internal reflections is $$L = 2\sqrt{3} N l_h / NA.$$

14. An illumination system according to claim 12, wherein said cylinder is of solid material with index of refraction n, the ray angle within the cylinder is given by $$\sin \theta = n \sin \theta'.$$

and the length of said solid cylinder for N internal reflections is $$L = 2\sqrt{3} n N l_h / NA.$$

15. An apparatus for transforming a light beam to selected characteristics of cross-section, uniform density distribution, self-luminance and selected numerical aperture, comprising:
    an aperture plate (34) providing an aperture of polygonal shape of selected dimensions to transmit a light beam making the cross-section of said light beam polygonal;
    first lens means (36) of focal length to focus the light beam into a selected plane;
    an internally reflecting beam-shaper-uniformizer (40) cylinder of selected length, having an axis and having as the selected plane an input plane, and having an exit plane, and having a polygonal cross-section of selected dimensions;
    diffuser means (42) placed at the exit plane to make the light beam more uniform and self-luminous; and
    a second lens (44) of focal length to collect light with selected numerical aperture and to image said diffuser means with selected magnification into an application plane.

16. The apparatus of claim 15 combined with and preceded by a first aperture plate (14) having an aperture of rectangular shape to transmit a light beam of elongated cross-section and to truncate the non-uniform periphery of the light beam;
    a cylindrical beam contracting means (18), to transform the truncated light beam of square cross-section; and
    a second aperture plate (26) having an aperture of square cross-section to sharpen the edges of the square light beam for input to the input plane of said cylinder.

17. The apparatus of claim 15 combined with and preceded by optical means (15) to collect and collimate the light from an extended point source (11,13,);
    beam splitter means (17) to transmit ultraviolet radiation and to reflect infra-red and visible radiation in the light beam; infra-red sink means (19) to absorb the infra-red and visible radiation;
    narrowband filter means (23) to select a spectrally narrow linewidth from the ultraviolet radiation; and
    movable flip mirror means (30) to relay the spectrally narrow ultraviolet beam to the input plane for said cylinder (40).

18. Apparatus according to claim 15 in which said cylinder is a solid cylinder of polygonal cross-section, composed of optical material in which multiple reflections take place by total internal reflection.

19. Apparatus according to claim 18 in which said cylinder optical material is solid quartz.

20. Apparatus according to claim 15, in which said cylinder is hollow, fabricated with strips of mirrors each having a reflecting surface, the reflecting surfaces of said mirrors facing the axis of said cylinder to produce multiple internal reflections making intensity distribution of the light beam uniform.

21. Apparatus according to claims 1–20, in which said beam-shaper-uniformizer (40) cylinder is of regular hexagonal configuration.

22. The method of providing a light beam for industrial patterning, characterized by the following steps:
    (a) Providing a non-uniform, non-self-luminous laser light beam;
    (b) Configuring the beam to eliminate the non-uniformities near the beam periphery;
    (c) Providing the semi-uniform light beam to a light gate;
    (d) Taking also a lamp light beam with optics and infra-red trap;
    (e) Gating selectively the laser light beam or the lamp light beam to a light beam characterization subsystem;
    (f) Configuring the selected semi-shaped semi-uniform non-self-luminous light beam to provide a selected shaped semi-uniform non-self-luminous light beam;
    (g) Focusing the selected shaped semi-uniform non-self-luminous light beam, with a focal length related to the desired numerical aperture, onto the input plane of a total-internally-reflective beam-shaper-uniformizer, causing multiple reflections within the uniformizer and overlapping of different parts of the beam with one another, the length of the beam-shaper-uniformizer being related to the desired intensity uniformity, resulting in a selected shaped uniform non-self-luminous light beam at the exit plane;
    (h) Diffusing the light beam;
    (i) Passing the selected shaped uniform self-luminous light beam through a collection lens to convey the beam with the selected numerical aperture toward an application subsystem.

* * * * *